United States Patent
Lee

(10) Patent No.: US 9,412,441 B2
(45) Date of Patent: *Aug. 9, 2016

(54) SEMICONDUCTOR MEMORY DEVICE

(71) Applicant: SK HYNIX INC., Icheon-si, Gyeonggi-do (KR)

(72) Inventor: Hee Youl Lee, Icheon-si (KR)

(73) Assignee: SK HYNIX INC., Icheon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/987,239

(22) Filed: Jan. 4, 2016

(65) Prior Publication Data

US 2016/0118109 A1 Apr. 28, 2016

Related U.S. Application Data

(63) Continuation-in-part of application No. 14/149,470, filed on Jan. 7, 2014, now Pat. No. 9,236,138.

(30) Foreign Application Priority Data

Aug. 13, 2013 (KR) ........................ 10-2013-0095910

(51) Int. Cl.
*G11C 11/34* (2006.01)
*G11C 11/56* (2006.01)
*G11C 16/04* (2006.01)
*G11C 7/14* (2006.01)
*G11C 16/10* (2006.01)
*G11C 16/34* (2006.01)

(52) U.S. Cl.
CPC *G11C 11/56* (2013.01); *G11C 7/14* (2013.01); *G11C 11/5628* (2013.01); *G11C 16/0483* (2013.01); *G11C 16/10* (2013.01); *G11C 16/3427* (2013.01); *G11C 2211/5641* (2013.01); *G11C 2211/5648* (2013.01)

(58) Field of Classification Search
USPC .................................................. 365/185.2
See application file for complete search history.

(56) References Cited

U.S. PATENT DOCUMENTS

| | | | |
|---|---|---|---|
| 9,236,138 B2 * | 1/2016 | Lee | G11C 16/3427 |
| 2008/0112221 A1 * | 5/2008 | Park | G11C 11/5628 |
| | | | 365/185.03 |
| 2011/0063917 A1 * | 3/2011 | Shiino | G11C 11/5635 |
| | | | 365/185.17 |
| 2011/0075484 A1 * | 3/2011 | Lee | G11C 16/28 |
| | | | 365/185.17 |
| 2011/0085385 A1 * | 4/2011 | Park | G11C 11/5621 |
| | | | 365/185.22 |
| 2011/0110153 A1 * | 5/2011 | Dutta | G11C 11/5628 |
| | | | 365/185.03 |
| 2012/0002472 A1 * | 1/2012 | Futatsuyama | G11C 11/10 |
| | | | 365/185.09 |
| 2012/0039122 A1 * | 2/2012 | Park | G11C 11/5621 |
| | | | 365/185.03 |
| 2012/0063231 A1 * | 3/2012 | Wood | G11C 16/10 |
| | | | 365/185.18 |
| 2012/0134208 A1 * | 5/2012 | Lee | G11C 11/5642 |
| | | | 365/185.03 |

(Continued)

FOREIGN PATENT DOCUMENTS

KR 1020100121128 A 11/2010
KR 1020120005841 A 1/2012

*Primary Examiner* — Hoai V Ho
*Assistant Examiner* — Pablo Huerta
(74) *Attorney, Agent, or Firm* — Hauptman Ham, LLP

(57) ABSTRACT

A semiconductor memory device includes a cell string including dummy memory cells and a plurality of memory cells in which n bit data is stored, and a peripherial circuit configured to store the n bit data in first memory cells, among the memory cells, store n−1 bit data in the rest of second memory cells, and store data which is not stored in the second memory cells in at least one of the dummy memory cells, among the dummy memory cells.

11 Claims, 11 Drawing Sheets

(56) References Cited

U.S. PATENT DOCUMENTS

| | | | | |
|---|---|---|---|---|
| 2013/0279250 A1* | 10/2013 | Park | G11C 16/28 | 365/185.03 |
| 2013/0308380 A1* | 11/2013 | Kim | G11C 16/06 | 365/185.03 |
| 2014/0085983 A1* | 3/2014 | Hosono | G11C 16/0408 | 365/185.17 |
| 2015/0078078 A1* | 3/2015 | D'Abreu | G11C 16/10 | 365/185.03 |

* cited by examiner

FIG. 6

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | | 2 bit | 2 bit | 2 bit | 2 bit | 2 bit | 2 bit | 2 bit | 2 bit | 1 bit | 2 bit | 1 bit | 2 bit | | | | X |

FIG. 7

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | | 2 bit | 2 bit | 2 bit | 2 bit | 2 bit | 2 bit | 2 bit | 1 bit | 2 bit | 2 bit | 1 bit | 2 bit | | | | X |

FIG. 8

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | | 2 bit | 2 bit | 2 bit | 2 bit | 2 bit | 2 bit | 1 bit | 2 bit | 2 bit | 1 bit | 2 bit | 2 bit | | | | X |

FIG. 9

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 2 bit | 2 bit | 2 bit | 2 bit | 2 bit | 2 bit | 2 bit | 1 bit | 2 bit | 1 bit | 2 bit | | | | | X |

FIG. 10

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 2 bit | 2 bit | 2 bit | 2 bit | 2 bit | 2 bit | 1 bit | 2 bit | 2 bit | 1 bit | 2 bit | | | | | X |

FIG. 11

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 2 bit | 2 bit | 2 bit | 2 bit | 2 bit | 1 bit | 2 bit | 2 bit | 1 bit | 2 bit | 2 bit | | | | | X |

FIG. 12

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 2 bit | 2 bit | 2 bit | 2 bit | 2 bit | 2 bit | 1 bit | 2 bit | 1 bit | 2 bit | 1 bit | 2 bit | 1 bit | 2 bit | | | X |

FIG. 13

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 2 bit | 2 bit | 2 bit | 1 bit | 2 bit | 2 bit | 1 bit | 2 bit | 2 bit | 1 bit | 2 bit | 2 bit | 1 bit | 2 bit | | | X |

FIG. 14

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 2 bit | 1 bit | 2 bit | 2 bit | 1 bit | 2 bit | 2 bit | 1 bit | 2 bit | 2 bit | 1 bit | 2 bit | 2 bit | | | X |

FIG. 15

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 2 bit | 2 bit | 2 bit | 2 bit | 2 bit | 1 bit | 2 bit | 1 bit | 2 bit | 1 bit | 2 bit | 1 bit | 2 bit | | | X |

FIG. 16

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 2 bit | 2 bit | 1 bit | 2 bit | 2 bit | 1 bit | 2 bit | 2 bit | 1 bit | 2 bit | 2 bit | 1 bit | 2 bit | | | X |

FIG. 17

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 2 bit | 1 bit | 2 bit | 2 bit | 1 bit | 2 bit | 2 bit | 1 bit | 2 bit | 2 bit | 1 bit | 2 bit | 2 bit | | | X |

FIG. 18

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | 2 bit | 2 bit | 2 bit | 2 bit | 2 bit | 2 bit | 1 bit | 2 bit | 1 bit | 2 bit | 1 bit | 2 bit | 1 bit | 2 bit | | | | X |

FIG. 19

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | 2 bit | 2 bit | 2 bit | 1 bit | 2 bit | 2 bit | 1 bit | 2 bit | 2 bit | 1 bit | 2 bit | 2 bit | 1 bit | 2 bit | | | | X |

FIG. 20

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | 2 bit | 2 bit | 1 bit | 2 bit | 1 bit | 2 bit | 2 bit | 1 bit | 2 bit | 2 bit | 1 bit | 2 bit | 2 bit | | | | | X |

FIG. 23

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | | 3 bit | 3 bit | 3 bit | 3 bit | 3 bit | 3 bit | 3 bit | 3 bit | 3 bit | 2 bit | 3 bit | 2 bit | 2 bit | | | X |

FIG. 24

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 3 bit | 3 bit | 3 bit | 3 bit | 3 bit | 3 bit | 3 bit | 2 bit | 3 bit | 2 bit | 3 bit | | | | | X |

FIG. 25

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 3 bit | 3 bit | 2 bit | 3 bit | 3 bit | 2 bit | 3 bit | 3 bit | 2 bit | 3 bit | 3 bit | 2 bit | 2 bit | | | X |

FIG. 26

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | | 3 bit | 3 bit | 3 bit | 3 bit | 3 bit | 3 bit | 2 bit | 3 bit | 2 bit | 3 bit | 2 bit | 3 bit | 1 bit | 2 bit | | X |

FIG. 27

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | | 4 bit | 4 bit | 4 bit | 4 bit | 4 bit | 4 bit | 4 bit | 4 bit | 4 bit | 3 bit | 4 bit | 3 bit | 2 bit | | | X |

FIG. 28

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 4 bit | 4 bit | 4 bit | 4 bit | 4 bit | 4 bit | 4 bit | 4 bit | 3 bit | 4 bit | 3 bit | 4 bit | | | | X |

FIG. 29

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | 2 bit | 4 bit | 4 bit | 3 bit | 4 bit | 4 bit | 3 bit | 4 bit | 4 bit | 3 bit | 4 bit | 4 bit | 3 bit | 2 bit | | | X |

FIG. 30

| SST | SDM3 | SDM2 | SDM1 | M1 | M2 | M3 | M4 | M5 | M6 | M7 | M8 | M9 | M10 | M11 | M12 | DDM1 | DDM2 | DDM3 | DST |
|---|---|---|---|---|---|---|---|---|---|---|---|---|---|---|---|---|---|---|---|
| X | | | | 4 bit | 4 bit | 4 bit | 4 bit | 4 bit | 4 bit | 3 bit | 4 bit | 3 bit | 4 bit | 3 bit | 4 bit | 1 bit | 2 bit | | X |

SEMICONDUCTOR MEMORY DEVICE

CROSS-REFERENCE TO RELATED APPLICATION

The present application is a Continuation in Part of U.S. patent application Ser. No. 14/149,470 filed on Jan. 7, 2014 which claims priority to Korean patent application number 10-2013-0095910 filed on Aug. 13, 2013, in the Korean Intellectual Property Office. The disclosure of the above-listed application is hereby incorporated by reference herein in their entirety.

FIELD

The present disclosure relates to an electronic device and, more particularly, to a semiconductor memory device.

BACKGROUND

The statements in this section merely provide background information related to the present disclosure and do not constitute prior art.

A semiconductor memory device is classified into a volatile memory device and a non-volatile memory device.

The volatile memory device performs a high speed data read and write operation, but the stored data is lost when the power is cut off. The non-volatile memory device operates at relatively lower write and read speeds, but the stored data is preserved even when the power is cut off. Therefore, the non-volatile memory device is used to store data that is to be maintained regardless of power supply. Examples of the non-volatile memory device include a read only memory (ROM) device, a programmable ROM (PROM) device, an electrically programmable ROM (EPROM) device, an electrically erasable and programmable ROM (EEPROM) device, a flash memory device, a phase-change RAM (PRAM) device, a magnetic RAM (MRAM) device, a resistive RAM (RRAM) device, a ferroelectric RAM (FRAM) device, or the like. The Flash memory device is typically divided into a NOR device and a NAND device.

The flash memory device enjoys the advantages of both RAM and ROM devices. For example, the flash memory device can be freely programmed and erased similar to the RAM device. Similar to the ROM device, the flash memory device can retain the stored data even when they are not powered. The flash memory device has been widely used as the storage media of portable electronic devices such as mobile phones, digital cameras, personal digital assistants (PDAs) and MP3 players. The flash memory device includes a plurality of memory cells that are adjacent to each other. Therefore, the inventor(s) has noted that interference and disturbance occur between the memory cells. Furthermore, the inventor(s) has noted that the memory cells connected to a word line closer to a drain selection line have more fail bits caused by program disturb. When the number of fail bits is greater than a reference number, the inventor(s) has experienced that a program operation is failed. The inventor(s) has experienced that the reliability of a semiconductor memory device is reduced for the reasons. the inventor(s) has experienced that a semiconductor memory device has high data reliability.

SUMMARY

In accordance with some embodiments, a semiconductor memory device comprises at least one cell string and a peripheral circuit. The at least one cell string includes a plurality of dummy memory cells and a plurality of memory cells connected in series between the plurality of dummy memory cells. And the peripheral circuit is configured to control the at least one cell string so that a first type of data represented by a first number of bits is stored in at least one of the dummy memory cells and a second type of data represented by a second number of bits, the second number smaller than the first number, is stored in at least two of the plurality of memory cells.

BRIEF DESCRIPTION OF THE DRAWINGS

The above and other features and advantages will become readily apparent by reference to the following detailed description when considered in conjunction with the accompanying drawings wherein:

FIGS. 6 to 20 are views of a program method of a semiconductor memory device according to some embodiments;

FIGS. 23 to 30 are views of program methods of a semiconductor memory device according to another embodiment;

DESCRIPTION OF EMBODIMENTS

Figure 1:
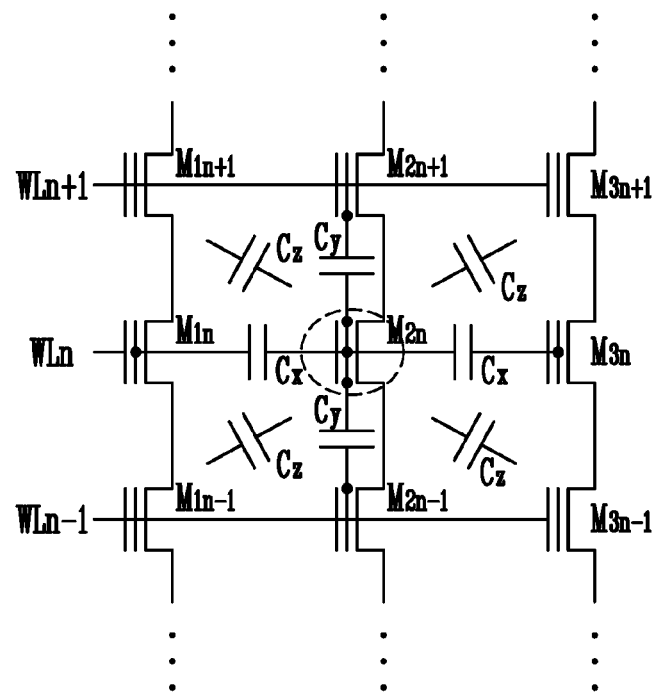
FIG. 1 is a circuit diagram of interference caused by neighboring memory cells.

Hereinafter, various embodiments will be described with reference to the accompanying drawings. In the drawings, illustrated thicknesses and distances of components are exaggerated compared to an actual physical thickness and interval for convenience of illustration. In the following description, detailed explanation of known related functions and constitutions is omitted to avoid unnecessarily obscuring the subject matter disclosed herein. Like reference numerals refer to like elements throughout the specification and drawings.

FIG. 1 is a circuit diagram of interference caused by neighboring memory cells.

Referring to FIG. 1, a threshold voltage of a memory cell M2n, which is coupled to an n-th word line and a second bit line, is shifted due to interference caused by neighboring eighth memory cells, which is triggered by capacitance Cx between memory cells M1n and M3n adjacent to the memory cell M2n in a word line direction, capacitance Cy between memory cells M2n+1 and M2n−1 adjacent to each other in a bit line direction, and capacitance Cz between memory cells M1n+1, M3n+1, M1n−1 and M3n+1 adjacent to each other in a diagonal direction.

Figure 2:
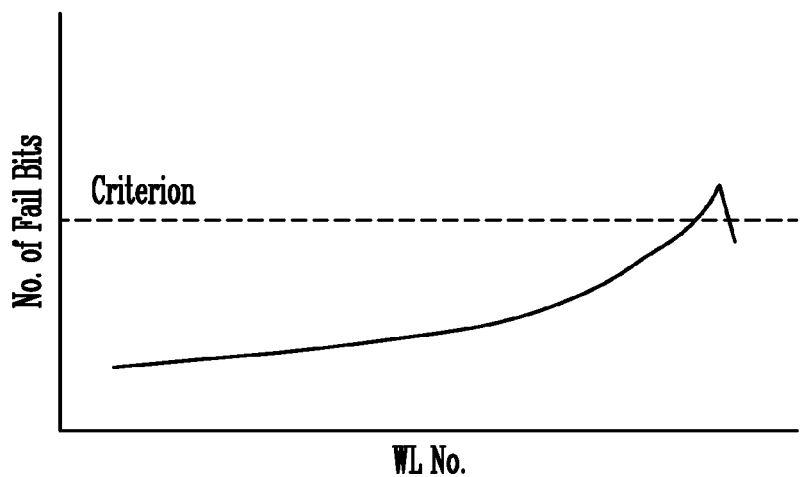
FIG. 2 is a view of the number of fail bits caused by a word-line program disturb.

FIG. 2 is a diagram of the number of fail bits caused by a word-line program disturb.

In general, a program operation on memory cells is sequentially performed from a word line adjacent to a source selection line in a drain selection line direction. As memory cells of a word line are closer to a drain selection line, threshold voltages of the memory cells are shifted more in a positive direction due to interference between neighboring cells as described with reference to FIG. 1. In addition, since the memory cells of the word line closer to the drain selection line have greater source-side resistances, the memory cells are greatly affected by interference in a word line direction.

Referring to FIG. 2, memory cells of a word line closer to a drain selection line have more number of fail bits caused by program disturb. When the number of fail bits is greater than criterion, program fail occurs.

Figure 3:
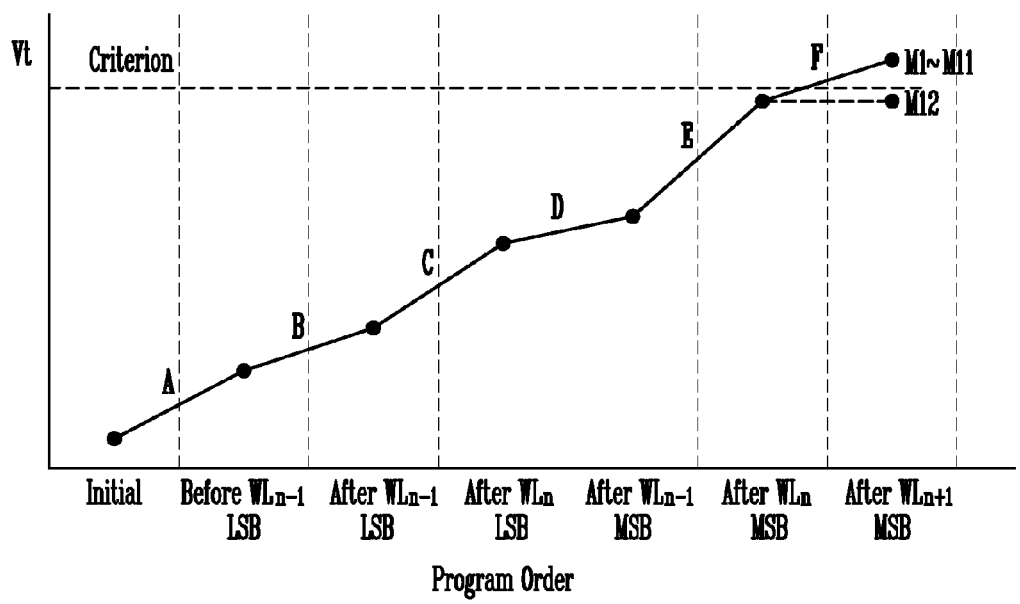
FIG. 3 is a view of changes in threshold voltages of memory cells according to a program order.

FIG. 3 is a diagram illustrating changes in threshold voltages of memory cells according to a program order.

Referring to FIG. 3, threshold voltage shift from an initial condition is not caused by interference until a Least Significant Bit (LSB) program operation is performed on memory cells connected to a word line WLn−1 (A). For example, threshold voltage shift of the memory cells is caused due to read disturb or pass disturb.

When an LSB program operation is performed on memory cells connected to the word line WLn−1 (B), threshold voltage shift of the memory cells is caused by pass disturb and interference in the word line direction and the diagonal direction.

When the LSB program operation is performed on memory cells connected to a word line WLn (C), threshold voltage shift of the memory cells is caused by program disturb and interference in the bit line direction.

When a Most Signification Bit (MSB) program operation is performed on memory cells connected to the word line WLn−1 (D), threshold voltage shift of the memory cells is caused by program disturb and additional interference in the word line direction as well as in the bit line direction.

When the MSB program operation is performed on memory cells connected to the word line WLn (E), threshold voltage shift of the memory cells is caused by program disturb and interference in the bit line direction.

When the MSB program operation is performed on memory cells connected to a word line WLn+1 (F), threshold voltage shift of the memory cells is caused by interference in the word line direction and the diagonal direction.

When twelve memory cells M1 to M12 are included in a single string and the memory cells M12 are adjacent to the drain selection line, a program operation is not performed after a program operation is performed on the memory cells M12 since there are no memory cells on which the program operation is subsequently performed between the memory cells M12 and the drain selection line. Therefore, a threshold voltage of the memory cells M12 is shifted less than the other memory cells M1 to M11. As a result, the number of fail bits caused by program disturb of the memory cells M12 is smaller than that of the other memory cells M1 to M11 (please refer to FIG. 2).

Figure 4:
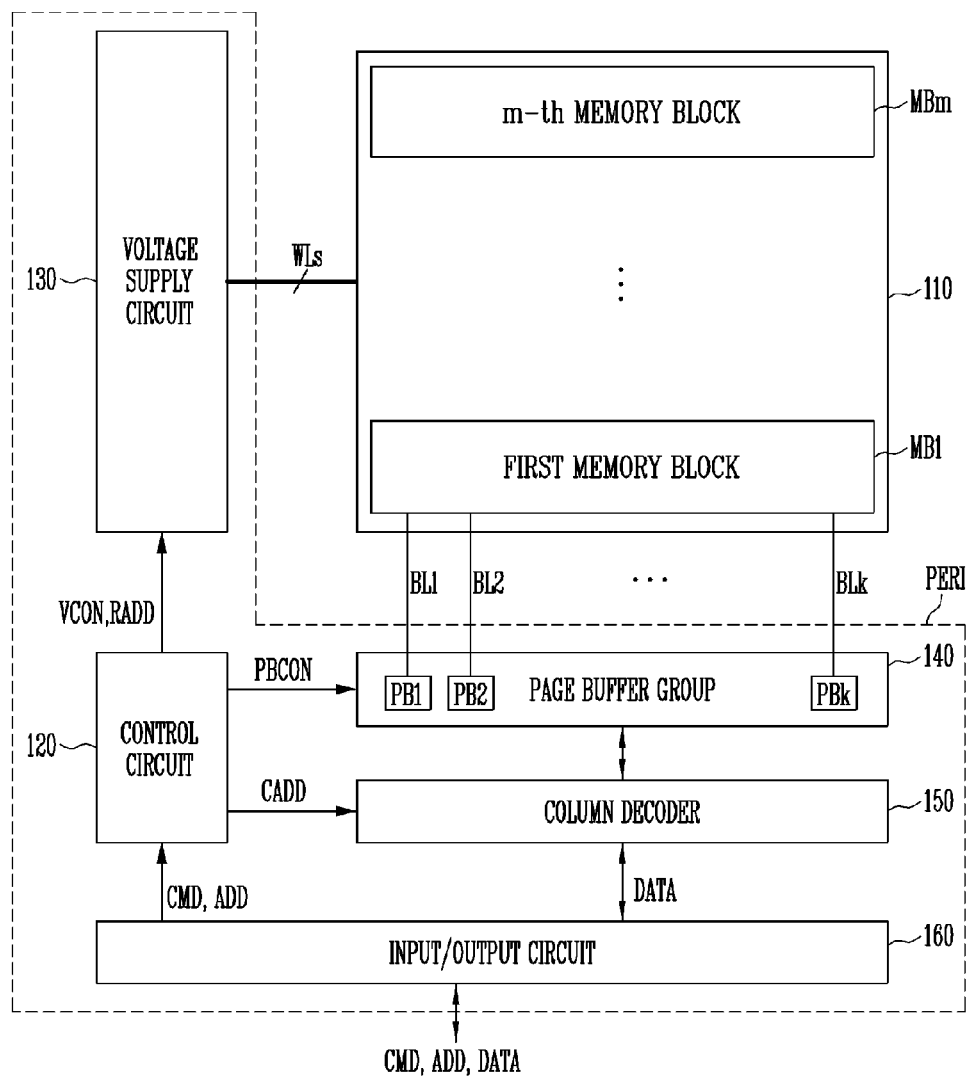
FIG. 4 is a block diagram of a semiconductor memory device according to some embodiments.
Figure 5:
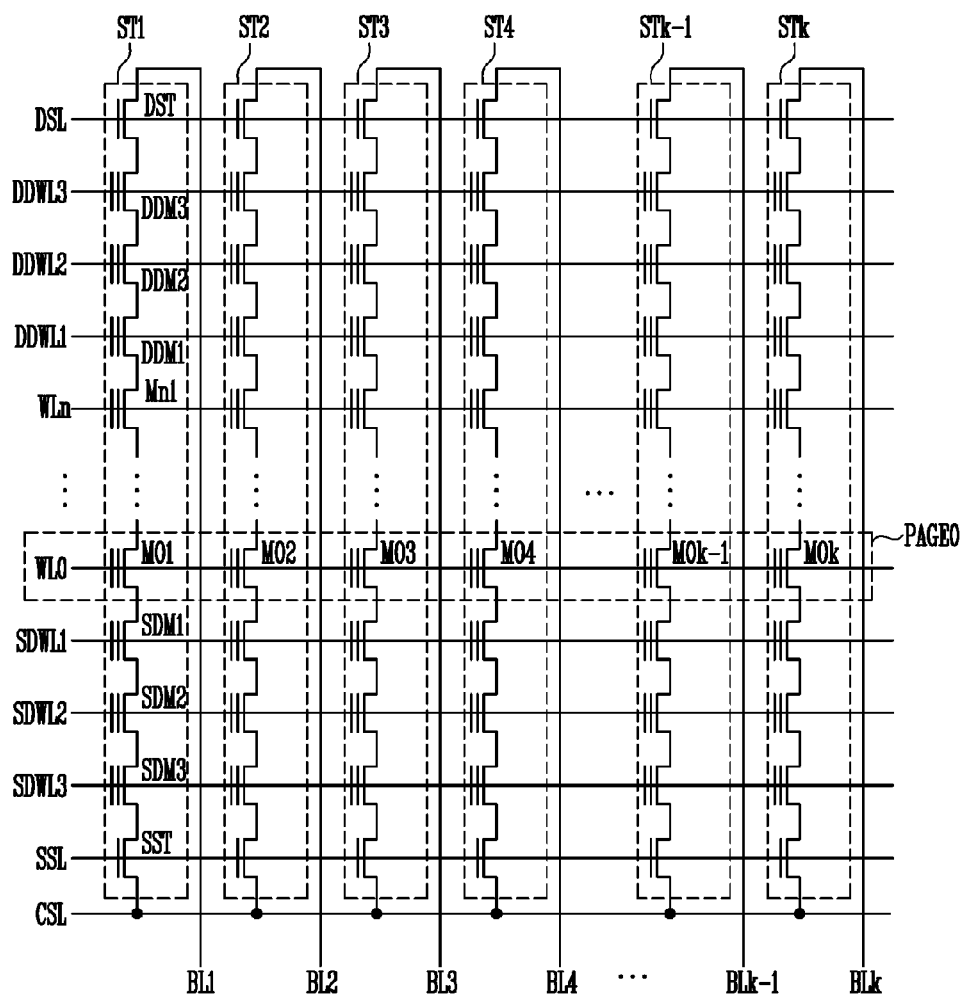
FIG. 5 is a circuit diagram of a memory block of FIG. 4.

FIG. 4 is a circuit diagram of a semiconductor memory device according to some embodiments. FIG. 5 is a circuit diagram of a memory block illustrated in FIG. 4.

Referring to FIG. 4, a semiconductor memory device 100 according to some embodiments includes a memory array 110 and a peripheral circuit PERI. The memory array 110 includes first memory block MB1 to m-th memory block MBm. The peripheral circuit PERI is configured to perform a program operation and a verify operation on memory cells included in a selected page of the memory blocks MB1 to MBm.

Referring to FIG. 5, each of the memory blocks includes strings ST1 to STk that are coupled between the bit lines BL1 to BLk and a common source line CSL. In other words, the strings ST1 to STk are coupled to the bit lines BL1 to BLk, respectively, and coupled in common to the common source line CSL. The string ST1 includes a source selection transistor SST having a source coupled to the common source line CSL, dummy memory cells SDM1 to SDM3 and DDM1 to DDM3, memory cells M01 to Mn1, and a drain selection transistor DST having a drain coupled to the bit line BL1. The memory cells SDM3 to SDM1, M01 to Mn1 and DDM1 to DDM3 are coupled in series between selection transistors SST and DST. A gate of the source selection transistor SST is coupled to the source selection line SSL. Gates of the dummy memory cells SDM1 to SDM3 and DDM1 to DDM3 are coupled to dummy word lines SDWL1 to SDWL3 and DDWL1 to DDWL3, respectively. Gates of the memory cells M01 to Mn1 are coupled to the word lines WL0 to WLn, respectively. A gate of the drain selection transistor DST is coupled to the drain selection line DSL.

Memory cells included in a memory block are divided into physical page units or logical page units. For example, memory cells M01 to M0k, which are coupled to a single word line, form a single physical page PAGE0. This page is a basic unit for a program operation.

The dummy memory cells SDM1 to SDM3 and DDM1 to DDM3 are divided into: (i) drain side dummy memory cells DDM1 to DDM3 between the memory cells M01 to Mn1 and the drain selection transistor DST; and (ii) source side dummy memory cells SDM1 to SDM3 between the memory cells M01 to Mn1 and the source selection transistor SST. FIG. 5 illustrates that both the drain side dummy memory cells DDM1 to DDM3 and the source side dummy memory cells SDM1 to SDM3 are included in the cell string ST1. However, the cell string ST1 includes only the drain side dummy memory cells DDM1 to DDM3 or the source side dummy memory cells SDM1 to SDM3. In addition, FIG. 5 illustrates that the cell string ST1 includes three drain side dummy memory cells DDM1 to DDM3 and three source side dummy memory cells SDM1 to SDM3. However, the above configuration is only illustrative, and the number of dummy memory cells is not limited thereto.

The memory cells M01 to Mn1 are configured to store a first type of data represented by a first number of bits. Although the dummy memory cells SDM1 to SDM3 and DDM1 to DDM3 have substantially the same configurations as the memory cells M01 to Mn1, the dummy memory cells SDM1 to SDM3 and DDM1 to DDM3 are configured not to store the data. The peripheral circuit PERI is configured to store N bit data where n is a positive integer of 2 or more in first memory cells, among the memory cells, (N−1) bit data in second memory cells, and bit data which is not stored in the second memory cells in at least one of the dummy memory cells. For example, the peripheral circuit PERI may include a control circuit 120, a voltage supply circuit 130, a page buffer group 140, a column decoder 150 and an input/output circuit 160. The control circuit 120 outputs a voltage control signal VCON in order to generate voltages necessary to perform a program operation or a verify operation in response to a command signal CMD, which is externally input through the input/output circuit 160, and outputs a page buffer (PB) control signal PBCON in order to control page buffers PB1 to PBk that are included in the page buffer group 140, depending on types of operations. In addition, the control circuit 120 outputs a row address signal RADD and a column address signal CADD in response to an address signal ADD, which is externally input through the input/output circuit 160. The control circuit 120 outputs the voltage control signal VCON and the row address signal RADD in order to store the first type of data represented by a first number of bits in at least one of the dummy memory cells SDM1 to SDM3 and DDM1 to DDM3 and store a second type of data represented by a second number of bits, which the second number is smaller than the first number, in at least two of the memory cells M01 to Mn1.

According to some embodiments, at least two memory cells are separated at regular intervals in the cell string ST1.

According to some embodiments, one of at least two memory cells is the second memory cell from the closest memory cell to the drain selection line in the source line direction, among the memory cells storing the first type of data.

According to some embodiments, one of at least two memory cells is the third memory cell from the closest memory cell to the drain selection line in the drain selection line, among the memory cells storing the first type of data.

The control circuit 120 outputs the voltage control signal VCON and the row address signal RADD in order to store the first type of data in at least one dummy memory cell and store the second type of data in at least two memory cells so that the total number of bits of data stored in the cell string ST1 are maintained. For example, in the case of multi level cells (MLC) in which a two-bit data is stored in one memory cell, the control circuit 120 may output the voltage control signal VCON and the row address signal RADD so that the two-bit data may be stored in one dummy memory cell and a one-bit data may be stored in each of two memory cells. Alternatively, the control circuit 120 outputs the voltage control signal VCON and the row address signal RADD so that the two-bit data may be stored in each of the two dummy memory cells and the one-bit data may be stored in each of four memory cells. Further, the above described technology is applied to a program operation in which three bits or more of data is stored in one memory cell. For example, in the case of triple level cells (TLC) in which three-bit data is stored in one memory cell, the control circuit 120 may output the voltage control signal VCON and the row address signal RADD so that the two-bit data may be stored in each of at least two memory cells, and the two-bit data may be stored in at least one of the dummy memory cells. Further, in the case of quadruple level cells (QLC) in which four-bit data is stored in at least one of the memory cells, the control circuit 120 may output the voltage control signal VCON and the row address signal RADD so that the three-bit data may be stored in each of at least two memory cells, and the two-bit data may be stored in at least one dummy memory cell.

The voltage supply circuit 130 applies operating voltages for a program operation or a verify operation on the memory cells onto local lines, which include the drain selection line DSL, the dummy word lines SDWL1 to SDWL3 and DDWL1 to DDWL3, the word lines WL0 to WLn and the source selection line SSL, in response to the voltage control signal VCON of the control circuit 120 of a selected memory block. The voltage supply circuit 130 includes a voltage generation circuit and a row decoder.

The voltage generation circuit outputs operating voltages for a program operation or a verify operation on the memory cells to global lines in response to the voltage control signal VCON from the control circuit 120. For example, the voltage generation circuit outputs a program voltage to be applied to memory cells of a selected page and a pass voltage to be applied to unselected memory cells to the global lines in order to perform a program operation. The voltage generation circuit outputs a verify voltage to be applied to the memory cells of the selected page and a pass voltage to be applied to the unselected memory cells onto the global lines in order to perform a verify operation.

In response to the row address signals RADD from the control circuit 120, the row decoder couples the global lines and the local lines DSL, SDWL1 to SDWL3, DDWL1 to DDWL3, WL0 to WLn and SSL so that operating voltages, which are output onto the global lines from the voltage generation circuit, are transferred to the local lines DSL, SDWL1 to SDWL3, DDWL1 to DDWL3, WL0 to WLn and SSL of the selected memory block in the memory array 110. Therefore, the program voltage is applied to a local word line, coupled to a selected cell, from the voltage generation circuit to the global word line. In addition, the pass voltage is applied to local word lines coupled to unselected cells from the voltage generation circuit through the global word lines. Therefore, data is stored in the selected cell by the program voltage.

The page buffer group 140 includes the page buffers PB1 to PBk coupled to the memory array 110 through the bit lines BL1 to BLk, respectively. The page buffers PB1 to PBk of the page buffer group 140 selectively precharge the bit lines BL1 to BLk on the basis of data being input in response to the PB control signal PBCON from the control circuit 120 so that the data are stored in the memory cells M01 to M0$k$.

The column decoder 150 selects the page buffers PB1 to PBk, included in the page buffer group 140, in response to the column address signal CADD which is output from the control circuit 120. In other words, the column decoder 150 sequentially transfers data to be stored in the memory cells to the page buffers PB1 to PBk in response to the column address signal CADD.

The input/output circuit 160 transfers externally input data to the column decoder 150 in response to control of the control circuit 120 in order to input the data to the page buffer group 140, so that the data are stored in the memory cells during a program operation. When the column decoder 150 transfers the data, transferred from the input/output circuit 160, to the page buffers PB1 to PBk of the page buffer group 140 in the same manner as described above, the page buffers PB1 to PBk store the input data in an internal latch circuit.

Figure 21:
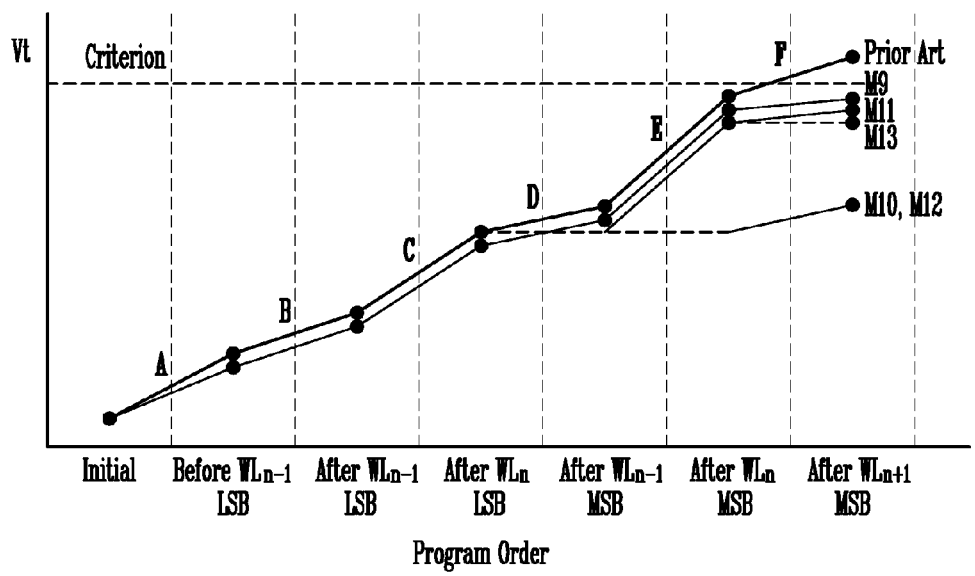
FIG. 21 is a view of changes in threshold voltages of memory cells according to a program order when a method, illustrated in FIG. 6, is performed.
Figure 22:
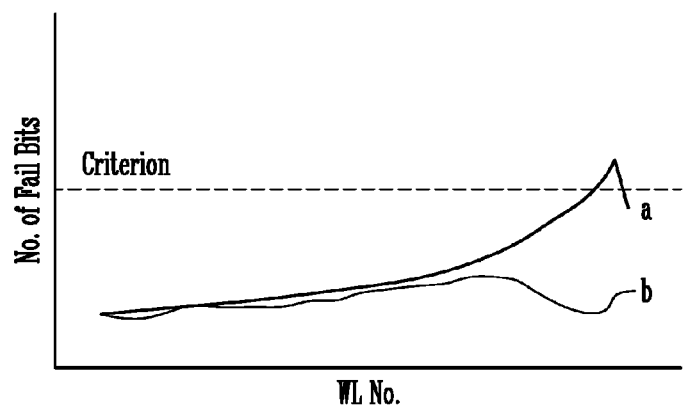
FIG. 22 is a view of the number of fail bits caused by a word-line program disturb when the method, illustrated in FIG. 6, is performed.

FIGS. 6 to 20 are diagrams illustrating a program method of a semiconductor memory device according to some embodiments. FIG. 21 is a diagram illustrating changes in threshold voltages of memory cells according to a program order when the method illustrated in FIG. 6 is performed. FIG. 22 is a diagram illustrating the number of fail bits caused by a word-line program disturb when the method illustrated in FIG. 6 is performed.

A description is made in reference to an example in which a single cell string includes three drain selection line-side dummy memory cells DDM1 to DDM3 (i.e., dummy memory cells DDM1 to DDM3 arranged at a direction of the drain selection line (DSL)), twelve memory cells M1 to M12 and three source selection line-side dummy memory cells SDM1 to SDM3 (i.e., dummy memory cells SDM1 to SDM3 arranged at a direction of the source selection line (SSL)). However, this exemplary embodiment is only illustrative, and the number of memory cells is not limited thereto. In addition, although a description is made in reference to an exemplary embodiment in which a two-bit data or one-bit data is stored in a memory cell, the number of bits is not limited thereto.

FIGS. 6 to 8 illustrate two-bit data is stored in the drain selection line-side dummy memory cell DDM1 and one-bit data, not the two-bit data, is stored in two memory cells.

Referring to FIG. 6, the two-bit data is stored in the drain selection line-side dummy memory cell DDM1. The one-bit data, not the two-bit data, is stored in the first memory cell M12, which is the second memory cell from a drain selection line-side in a source selection line direction, and the second memory cell M10, which is the fourth memory cell, among the memory cells (including DDM1) storing the two-bit data.

Referring to FIG. 21, since only the LSB program operation is performed on the adjacent memory cell M11, a final threshold voltage of the memory cell DDM1, which is the closest to a drain selection line, is reduced, and interference in the word line direction and the diagonal direction is reduced. Since the number of times a program operation is performed is reduced, pass disturb of an unselected word line adjacent to a selected word line is also reduced. As a result, threshold voltage shift caused by program disturb is reduced.

Since the MSB program operation is not performed on the first memory cell M10 and the second memory cell M12, stress caused by applying the program voltage is reduced. In addition, since threshold voltage shift caused by a program operation of a neighboring bit line is reduced, interference in the bit line direction is reduced. Threshold voltage shift caused by the program disturb is reduced the most.

Since interference in the word line direction and the diagonal direction is reduced by the first and second memory cells M10 and M12, threshold voltage shift caused by program disturb of the memory cell M11 is reduced between the first and second memory cells M10 and M12.

Since interference in the word line direction and the diagonal direction, caused by the second memory cell M10, is reduced, threshold voltage shift caused by program disturb of the memory cell M9, adjacent to the second memory cell M10, is reduced.

FIG. 22 in accordance with at least one embodiment illustrates a reduction (a->b, i.e., a reduction in number of fail is incurred from curve 'a' to curve 'b') in number of fail bits caused by the five drain selection line-side memory cells M9 to M12 and DDM1.

Referring to FIG. 7, the two-bit data is stored in the drain selection line-side dummy memory cell DDM1. The one-bit data, rather than the second-bit data, is stored in the first memory cell M12, which is the second memory cell from the drain selection line-side in the source selection line direction, and the second memory cell M9, which is the fifth memory cell, among the memory cells (including DDM1) storing the two-bit data.

FIG. 6 illustrates a single memory cell storing two bits exists between memory cells storing one bit according to at least one embodiment. However, FIG. 7 illustrates two memory cells storing two bits exist between memory cells storing one bit. Therefore, threshold voltage shift of six drain selection line-side memory cells M8 to M12 and DDM1, caused by program disturb, is reduced.

Referring to FIG. 8, two-bit data is stored in the drain selection line-side dummy memory cell DDM1 (i.e., dummy memory cell DDM1 arranged at a direction of the drain selection line). One-bit data, not the two-bit data, is stored in the first memory cell M11, which is the third memory cell from the drain selection line-side in the source selection line direction, and the second memory cell M8, which is the sixth memory cell, among the memory cells (including DDM1) storing the two-bit data.

In this manner, interference in the word line direction and the diagonal direction of the memory cells M7, M9, M10, M12 and DDM1 is reduced. Threshold voltage shift caused by program disturb of the seven drain selection line-side memory cells M7 to M12 and DDM1 is reduced.

As described above, two-bit data is stored in one of the drain selection line-side dummy memory cells, and one-bit data, rather than the first two-bit data, is stored in two memory cells, so that threshold voltage shift of a memory cell to be programmed is reduced while the total number of bits of data to be stored is maintained. In addition, since stress caused by applying a program voltage is reduced, threshold voltage shift caused by program disturb is reduced. Also, since the number of ISPP loops being performed is reduced, threshold voltage shift caused by pass disturb of an unselected word line adjacent to a selected word line is reduced. Therefore, a plurality of memory cells have improved program disturb characteristics.

FIGS. 9 to 11 illustrate two-bit data is stored in the source selection line-side dummy memory cell SDM1 and one-bit data, not the two-bit data, is stored in two memory cells.

Referring to FIG. 9, the two-bit data is stored in the source selection line-side dummy memory cell SDM1. The one-bit data, not the two-bit data, is stored in the first memory cell M11, which is the second memory cell from the drain selection line-side in the source selection line direction, and the second memory cell M9, which is the fourth memory cell, among the memory cells (including SDM1) storing the two-bit data. In substantially the same manner as illustrated in FIG. 6, threshold voltage shift caused by program disturb of the five drain selection line-side memory cells M8 to M12 is reduced.

Referring to FIG. 10, the two-bit data is stored in the source selection line-side dummy memory cell SDM1. The one-bit data, not the two-bit data, is stored in the first memory cell M11, which is the second memory cell from the drain selection line-side in the source selection line direction, and the second memory cell M8, which is the fifth memory cell, among the memory cells (including SDM1) storing the two-bit data. In substantially the same manner as illustrated in FIG. 7, threshold voltage shift caused by program disturb of the six drain selection line-side memory cells M7 to M12 is reduced.

Referring to FIG. 11, the two-bit data is stored in the source selection line-side dummy memory cell SDM1. The one-bit data, not the two-bit data, is stored in the first memory cell M10, which is the third memory cell from the drain selection line-side in the source selection line direction, and the second memory cell M7, which is the sixth memory cell, among the memory cells (including SDM1) storing the two-bit data. In substantially the same manner as illustrated in FIG. 8, interference in the word line direction and the diagonal direction of the memory cells M6, M8, M9, M11 and M12 is reduced. Threshold voltage shift caused by program disturb of the seven drain selection line-side memory cells M6 to M12 is reduced.

FIGS. 12 to 14 illustrate two-bit data is stored in the drain selection line-side dummy memory cell DDM1 and the source selection line-side dummy memory cell SDM1 and one-bit data, not the two-bit data, is stored in four memory cells.

Referring to FIG. 12, the two-bit data is stored in the drain selection line-side dummy memory cell DDM1 and the source selection line-side dummy memory cell SDM1. The one-bit data, not the two-bit data, is stored in the memory cell M12, which is the second memory cell from the drain selection line-side in the source selection line direction, the memory cell M10, which is the fourth memory cell, the memory cell M8, which is the sixth memory cell, and the memory cell M6, which is the eighth memory cell, among the memory cells (including DDM1 and SDM1) storing the two-bit data. In this manner, threshold voltage shift caused by program disturb of the nine memory cells M5 to M12 and DDM1 is reduced.

Referring to FIG. 13, the two-bit data is stored in the drain selection line-side dummy memory cell DDM1 and the source selection line-side dummy memory cell SDM1. The one-bit data, not the two-bit data, is stored in the memory cell M12, which is the second memory cell from the drain selection line-side in the source selection line direction, the memory cell M9, which is the fifth memory cell, the memory cell M6, which is the eighth memory cell, and the memory cell M3, which is the eleventh memory cell, among the memory cells (including DDM1 and SDM1) storing the two-bit data. In this manner, threshold voltage shift caused by program disturb of the twelve drain selection line-side memory cells M2 to M12 and DDM1 is reduced.

Referring to FIG. 14, the two-bit data is stored in the drain selection line-side dummy memory cell DDM1 and the source selection line-side dummy memory cell SDM1. The one-bit data, not the two-bit data, is stored in the memory cell M11, which is the third memory cell from the drain selection line-side in the source selection line direction, the memory cell M8, which is the sixth memory cell, the memory cell M5, which is the ninth memory cell, and the memory cell M2, which is the twelfth memory cell, among the memory cells (including DDM1 and SDM1) storing the two-bit data. In this manner, threshold voltage shift caused by program disturb of the thirteen drain selection line-side memory cells M1 to M12 and DDM1 is reduced.

FIGS. 15 and 16 illustrate two-bit data is stored in the drain selection line-side dummy memory cell DDM2, one-bit data is stored in the drain selection line-side dummy memory cell DDM1 and one-bit data, not the two-bit data, is stored in three memory cells.

Referring to FIG. 15, the two-bit data is stored in the drain selection line-side dummy memory cell DDM2, and the one-bit data is stored in the drain selection line-side dummy memory cell DDM1. The one-bit data, not the two-bit data, is stored in the memory cell M11, which is the fourth memory cell from the drain selection line-side in the source selection line direction, the memory cell M9, which is the sixth memory cell, and the memory cell M7, which is the eighth memory cell, among the memory cells (including DDM2) storing the two-bit data. In this manner, threshold voltage shift caused by program disturb of the nine drain selection line-side memory cells M6 to M12, DDM1 and DDM2 is reduced.

Referring to FIG. 16, the two-bit data is stored in the drain selection line-side dummy memory cell DDM2. The one-bit data is stored in the drain selection line-side dummy memory cell DDM1. The one-bit data, not the two-bit data, is stored in the second memory cell M10, which is the fifth memory cell from the drain selection line-side in the source selection line direction, the memory cell M7, which is the eighth memory cell, and the memory cell M4, which is the eleventh memory cell, among the memory cells (including DDM2) storing the two-bit data. In this manner, threshold voltage shift caused by program disturb of the twelve drain selection line-side memory cells M3 to M12, DDM1 and DDM2 is reduced.

FIG. 17 illustrates two-bit data is stored in two drain selection line-side dummy memory cells DDM2 and DDM1 and one-bit data, not the two-bit data, is stored in four memory cells.

Referring to FIG. 17, the two-bit data is stored in the drain selection line-side dummy memory cells DDM1 and DDM2. The one-bit data, not the two-bit data, is stored in the memory cell M12, which is the third memory cell from the drain selection line-side in the source selection line direction, the memory cell M9, which is the sixth memory cell, the memory cell M6, which is the ninth memory cell, and the memory cell M3, which is the twelfth memory cell, among the memory cells (including DDM2 and DDM1) storing the two-bit data. In this manner, threshold voltage shift caused by program disturb of the thirteen drain selection line-side memory cells M2 to M12, DDM1 and DDM2 is reduced.

FIGS. 18 to 20 illustrate two-bit data is stored in two source selection line-side dummy memory cell SDM1 and SDM2 and one-bit data, not the two-bit data, is stored in four memory cells.

Referring to FIG. 18, the two-bit data is stored in the source selection line-side dummy memory cells SDM1 and SDM2. The one-bit data, not the two-bit data, is stored in the memory cell M11, which is the second memory cell from the drain selection line-side in the source selection line direction, the memory cell M9, which is the fourth memory cell, the memory cell M7, which is the sixth memory cell, and the memory cell M5, which is the eighth memory cell, among the memory cells (including SDM1 and SDM2) storing the two-bit data. In this manner, threshold voltage shift caused by program disturb of the nine drain selection line-side memory cells M4 to M12 is reduced.

Referring to FIG. 19, the two-bit data is stored in the source selection line-side dummy memory cells SDM1 and SDM2. The one-bit data, not the two-bit data, is stored in the memory cell M11, which is the second memory cell from the drain selection line-side in the source selection line direction, the memory cell M8, which is the fifth memory cell, the memory cell M5, which is the eighth memory cell, and the memory cell M2, which is the eleventh memory cell, among the memory cells (including SDM1 and SDM2) storing two-bit data. In this manner, threshold voltage shift caused by program disturb of the twelve drain selection line-side memory cells M1 to M12 is reduced.

Referring to FIG. 20, the two-bit data is stored in the source selection line-side dummy memory cells SDM1 and SDM2. The one-bit data, not the two-bit data, is stored in the memory cell M10, which is the third memory cell from the drain selection line-side in the source selection line direction, the memory cell M7, which is the sixth memory cell, the memory cell M4, which is the ninth memory cell, and the memory cell M1, which is the eleventh memory cell, among the memory cells (including SDM1 and SDM2) storing the two-bit data. Threshold voltage shift caused by program disturb of the thirteen drain selection line-side memory cells SDM1 and M1 to M12 is reduced.

FIGS. 23 to 30 illustrate program methods of a semiconductor memory device according to another embodiment of the present invention. FIGS. 23 to 26 illustrate program methods according to various embodiments of triple level cells (TLC), and FIGS. 27 to 30 illustrate program methods according to various embodiments of quadruple level cells (QLC).

Referring to FIG. 23, a three-bit data is stored in the memory cells M1 to M9 and M11, and a two-bit is stored in some memory cells M10 and M12. For example, when the two-bit data is stored in two memory cells M10 and M12, the memory cells lack the two-bit data. The bit data which the memory cells lack is stored in a first dummy memory cell DDM1 at the drain select transistor DST side. For example, when the memory cells lack the two-bit data, the two-bit data may be stored in the first dummy memory cell DDM1. LBS data, center signification bit (CSB) data and MSB data are stored in the triple level cells (TLC). The LSB data and the CBS data are stored in the memory cells M10 and M12 in which the two-bit data is stored, and the MSB data is stored in the first dummy memory cell DDM1. The position of the memory cells at which the two-bit data is stored may be changed.

Referring to FIG. 24, the three-bit data is stored in the memory cells M1 to M8, M10 and M12, but the two-bit data is stored in some memory cells M9 and M11. Data which the memory cells lack is stored in the first dummy memory cell SDM1 at the source select transistor SST side. For example, when the memory cells lack the two-bit data, the two-bit data may be stored in the first dummy memory cell SDM1. The position of the memory cells at which the two-bit data is stored may be changed.

Referring to FIG. 25, the three-bit data is stored in the memory cells M1, M2, M4, M5, M7, M8, M10 and M11, but the two-bit data is stored in some memory cells M3, M6, M9 and M12. A four-bit data which the memory cells lack is stored in the first dummy memory cells DDM1 and SDM1 at the drain select transistor DST and the source select transistor SST sides. For example, when the memory cells lack the four-bit data, the two-bit data is stored in each of the first dummy memory cells DD1 and SDM1. The position of the memory cells at which the two-bit data is stored may be changed.

Referring to FIG. 26, the three-bit data is stored in the memory cells M1 to M6, M8, M10 and M12, but the two-bit data is stored in some memory cells M7, M9 and M11. The three-bit data which the memory cells lack is stored in the dummy memory cells DDM1 and DDM2 at the drain select transistor DST side. For example, when the memory cells lack the three-bit data, the one-bit data is stored in the first dummy memory cell DDM1, and the two-bit data is stored in the second dummy memory cell DDM2. The position of the memory cells at which the two-bit data is stored may be changed. Further, the number of bits stored in the first and second dummy memory cells DDM1 and SSM2 may be changed. In addition, the three-bit data which the memory cells lack is stored in the dummy memory cells SDM1 and SDM2 at the source select transistor SST side.

Referring to FIG. 27, the four-bit data is stored in the memory cells M1 to M9 and M11, but the three-bit is stored in some memory cells M10 and M12. For example, when the three-bit data is stored in the two memory cells M10 and M12, the memory cells lack the two-bit data. The bit data which the memory cells lack is stored in the first dummy memory cell DDM1 at the drain select transistor DST side. For example, when the memory cells lack the two-bit data, the two-bit data is stored in the first dummy memory cells DDM1. The LBS data, 1CSB data, 2CSB data and the MSB data are stored in the quadruple level cells (QLC), the LBS data, the 1CSB data, and the 2CSB data are stored in the memory cells M10 and M12 in which the three-bit data is stored, and the MSB data is stored in the first dummy memory cell DDM1. The position of the memory cells at which the three-bit data is stored may be changed.

Referring to FIG. 28, the four-bit data is stored in the memory cells M1 to M8, M10 and M12, but the three-bit data is stored in some memory cells M9 and M11. The data which the memory cells lack is stored in the first dummy memory cell SDM1 at the source select transistor SST side. For example, when the memory cells lack the two-bit data, the two-bit data is stored in the first dummy memory cell SDM1. The position of the memory cell at which the three-bit data is stored may be changed.

Referring to FIG. 29, the four-bit data is stored in the memory cells M1, M2, M4, M5, M7, M8, M10 and M11, but the three-bit data is stored in some memory cells M3, M6, M9 and M12. The four-bit data which the memory cells lack is stored in the first dummy memory cells DDM1 and SDM1 at the drain select transistor DST and the source select transistor SST sides. For example, when the memory cells lack the four-bit data, the two-bit data is stored in each of the first dummy memory cells DDM1 and SDM1. The position of the memory cells at which the three-bit data is stored may be changed.

Referring to FIG. 30, the four-bit data is stored in the memory cells M1 to M6, M8, M10 and M12, but the three-bit data is stored in some memory cells M7, M9 and M11. The three-bit data which the memory cells lack is stored in the first dummy memory cells DDM1 and DDM2 at the drain select transistor DST side. For example, when the memory cells lack the three-bit data, the one-bit data is stored in the first dummy memory cell DDM1 and the two-bit data is stored in the second dummy memory cell DDM2. The position of the memory cells at which the three-bit data is stored may be changed, and the number of bits stored in the first and second memory cells DD1 and SSM2 may be changed. Further, the three-bit data which the memory cells lack is stored in the dummy memory cells SDM1 and SDM2 at the source select transistor SST side. Except for the above described the multi level cells (MLC), the triple level cells (TLC) and the quadruple level cells (QLC), the above described program method is applied to a semiconductor memory device in which data more than five bit is stored in one memory cell.

Figure 31:
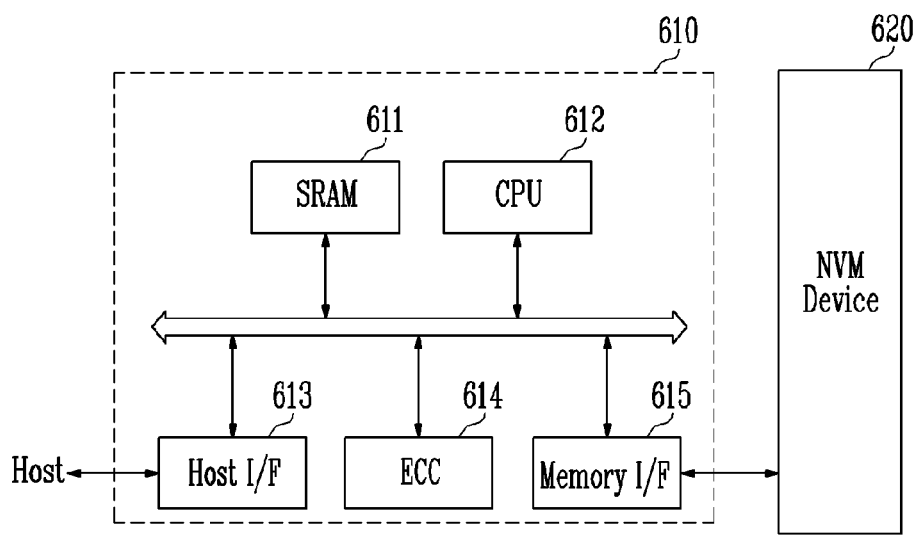
FIG. 31 is a schematic block diagram of a memory system according to some embodiments.

FIG. 31 is a schematic block diagram of a memory system according to at least one embodiment of the present invention.

Referring to FIG. 31, a memory system 600 according to some embodiments includes a memory controller 610 and a non-volatile memory device 620.

The non-volatile memory device 620 is configured into the above-described semiconductor memory device and operated by the above-described method for compatibility with the memory controller 610. The memory controller 610 is configured to control the non-volatile memory device 620. The memory system 600 having the above-described configuration is a memory card or a solid state disk (SSD) in which the non-volatile memory device 620 and the memory controller 610 are combined. SRAM 611 is configured to function as an operation memory of a CPU 612. A host interface 613 includes a data exchange protocol of a host being coupled to the memory system 600. An ECC 614 is configured to detect and correct errors included in a data read from the non-volatile memory device 620. A memory interface 615 is configured to interface with the non-volatile memory device 620. The CPU 612 is configured to perform the general control operation for data exchange of the memory controller 610.

Though not illustrated in FIG. 23, the memory system 600 further includes ROM (not illustrated) that stores code data to interface with the host. In addition, the non-volatile memory device 620 is a multi-chip package having a plurality of flash memory chips. The memory system 600 is provided as a storage medium having high reliability and low error rate. A flash memory device according to some embodiments is provided in a memory system such as a semiconductor disk device (a solid state disk (SSD)) on which research has been actively conducted. For example, when the memory system 600 is an SSD, the memory controller 610 communicates with an external device (e.g., a host) through one of the interface protocols including USB, MMC, PCI-E, SATA, PATA, SCSI, ESDI and IDE.

Figure 32:
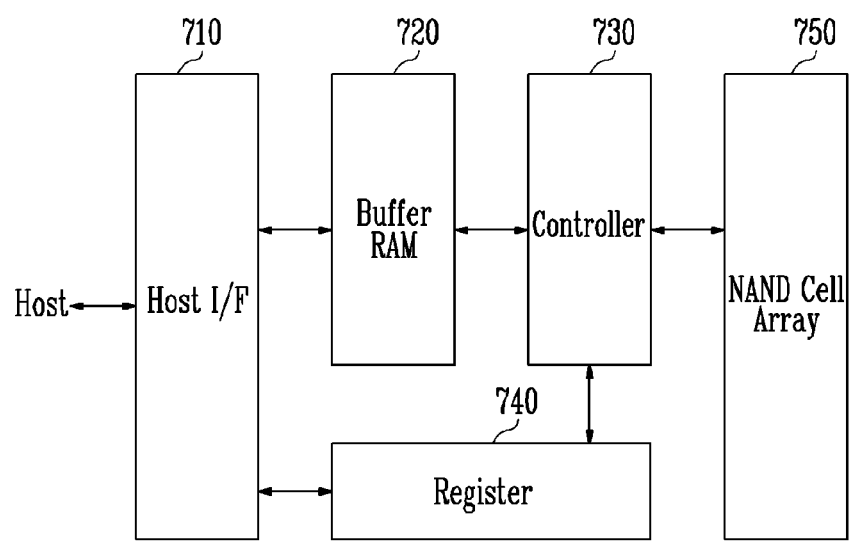
FIG. 32 is a schematic block diagram of a fusion memory device or a fusion memory system configured to perform a program operation according to some embodiments.

FIG. 32 is a schematic block diagram of a fusion memory device or a fusion memory system that performs a program operation according to the aforementioned various embodiments. For example, technical features of the present disclosure are applied to a OneNand flash memory device 700 as the fusion memory device.

The OneNand flash memory device 700 includes a host interface (I/F) 710, a buffer RAM 720, a controller 730, a register 740 and a NAND flash cell array 750. The host interface 710 is configured to exchange various types of information with a device through a different protocol. The buffer RAM 720 has built-in codes for driving the memory device or temporarily stores data. The controller 730 is configured to control read and program operations and every state in response to a control signal and a command that are externally given. The register 740 is configured to store data including instructions, addresses and configurations defining a system operating environment in the memory device. The NAND flash cell array 750 includes operating circuits including non-volatile memory cells and page buffers. In response to a write request from a host, the OneNAND flash memory device 700 programs data in the aforementioned manner.

Figure 33:
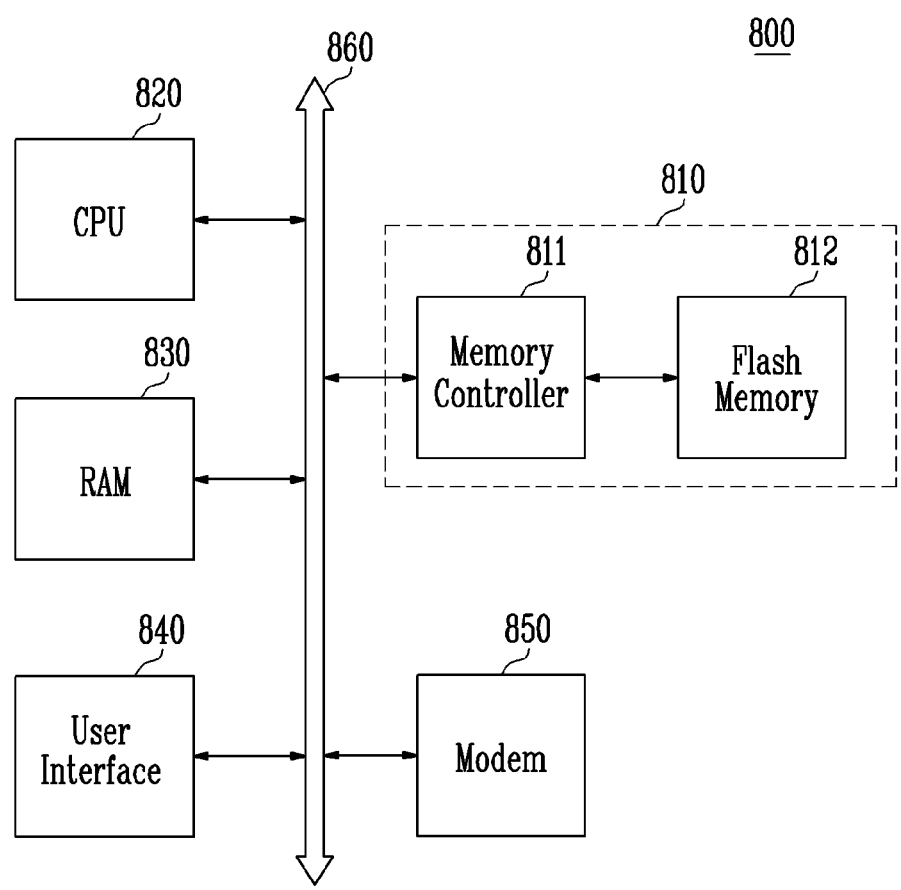
FIG. 33 is a schematic block diagram of a computing system including a flash memory device according to some embodiments.

FIG. 33 is a schematic block diagram of a computing system including a flash memory device 812 according to an embodiment of the present invention.

A computing system 800 according to some embodiments includes a microprocessor (CPU) 820, random-access memory (RAM) 830, a user interface 840, a modem 850, such as a baseband chipset, and a memory system 810 that are electrically coupled to a system bus 860. In addition, if the computing system 800 is a mobile device, then a battery is additionally provided to apply operating voltages to the computing system 800. Though not shown in FIG. 8, the computing system 800 further includes application chipsets, a Camera Image Processor (CIS), or mobile DRAM. The memory system 810 forms a Solid State Drive/Disk (SSD) that uses a non-volatile memory to store data. The memory system 810 is provided as a fusion flash memory (e.g., OneNAND flash memory).

According to some embodiments, since a semiconductor memory device prevents fail caused by program disturb, the semiconductor memory device has increased data reliability. In addition, yield and program performance is improved.

Various embodiments described above are not limited to a device and a method but is implemented through a program implementing functions corresponding to the features of embodiments or a non-transitory, computer-readable recording medium where the program is recorded. Such implementation is easily done by a person of ordinary skill in the art based on the description of the embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment are used singly or in combination with features, characteristics, and/or elements described in connection with other embodiments unless otherwise specifically indicated. Although embodiments have been described with reference to a number of illustrative embodiments thereof, it should be understood that numerous other modifications and various embodiments can be devised by those skilled in the art that will fall within the spirit and scope of the claimed invention as set forth in the following claims.

What is claimed is:

1. A semiconductor memory device, comprising:
a cell string including dummy memory cells and a plurality of memory cells in which n bit data is stored; and
a peripheral circuit configured to store the n bit data in first memory cells, among the memory cells, store n−1 bit data in at least one of second memory cells, and store data which is not stored in the second memory cells in at least one of the dummy memory cells, among the dummy memory cells.

2. The semiconductor memory device of claim 1, wherein the cell string further comprises a drain select transistor and a source select transistor.

3. The semiconductor memory device of claim 2, wherein the dummy memory cells comprises drain-side dummy memory cells adjacent to the drain select transistor and source-side dummy memory cells adjacent to the source select transistor.

4. The semiconductor memory device of claim 3, wherein the plurality of memory cells is connected between the drain-side dummy memory cells and the source-side dummy memory cells.

5. The semiconductor memory device of claim 1, wherein when the n is three, three-bit data includes Least Signification Bit (LSB) data, Center Signification Bit (CSB) data and Most Signification Bit (MSB) data, and when the N is four, four-data bit includes the LSB data, 1 CBS data, 2 CSB data and the MSB data.

6. The semiconductor memory device of claim 5, wherein when the n is three, the peripheral circuit is configured to:
store the LSB data, the CSB data, and the MSB data in first memory cells, and
store the LSB data and the CSB data in second memory cells.

7. The semiconductor memory device of claim 5, wherein when the n is four, the peripheral circuit is configured to:
store the LSB data, the 1 CSB data, the 2 CSB data, and the MSB data in first memory cells; and
store the LSB data, the 1 CSB data and the 2 CSB data in second memory cells.

8. The semiconductor memory device of claim 5, wherein a peripheral circuit is configured to store the MSB data which is not stored in the second memory cells in at least one of the dummy memory cells.

9. The semiconductor memory device of claim 8, wherein when the second memory cells include two memory cells, the peripheral circuit stores the MSB data including two bits which is not stored in the second memory cells in one of the dummy memory cells, or in two dummy memory cells separately.

10. The semiconductor memory device of claim 9, wherein when the MSB data including the two bits is stored in the one dummy memory cell, the peripheral circuit stores all of the MSB data including the two bits in the one dummy memory cell.

11. The semiconductor memory device of claim 9, wherein when the MSB data of the two-bit data is stored in the two dummy memory cells separately, the peripheral circuit stores one-bit of the MSB data, among the MSB data including the two bits, in one of the two dummy memory cells, and stores the other bit of the MSB data in the other dummy memory cell.

* * * * *